US010128610B1

(12) United States Patent
Takamori et al.

(10) Patent No.: US 10,128,610 B1
(45) Date of Patent: Nov. 13, 2018

(54) ELECTRONIC DEVICE HAVING A TILT RESTRAINING MEMBER

(71) Applicant: PFU LIMITED, Kahoku-shi, Ishikawa (JP)

(72) Inventors: Masaya Takamori, Kahoku (JP); Shigeru Yonemura, Kahoku (JP)

(73) Assignee: PFU LIMITED, Kahoku-Shi, Ishikawa (JP)

( * ) Notice: Subject to any disclaimer, the term of this patent is extended or adjusted under 35 U.S.C. 154(b) by 0 days.

(21) Appl. No.: 15/898,075

(22) Filed: Feb. 15, 2018

(30) Foreign Application Priority Data

Nov. 8, 2017 (JP) .................................. 2017-215636

(51) Int. Cl.
| | | |
|---|---|---|
| *H01R 13/44* | (2006.01) | |
| *H01R 13/56* | (2006.01) | |
| *H01R 27/02* | (2006.01) | |
| *H01R 13/447* | (2006.01) | |
| *H05K 5/02* | (2006.01) | |
| *H01R 13/639* | (2006.01) | |

(52) U.S. Cl.
CPC ......... *H01R 13/562* (2013.01); *H01R 13/447* (2013.01); *H01R 13/639* (2013.01); *H01R 27/02* (2013.01); *H05K 5/0247* (2013.01)

(58) Field of Classification Search
CPC .... H01R 13/44; H01R 13/443; H01R 13/447; H01R 13/453; H01R 13/4532; H01R 13/4534; H01R 13/4538; H01R 13/4361; H01R 13/562; H01R 13/639; H01R 27/02; H01R 33/97; H05K 5/0247

USPC ................................... 439/133–156, 347–348
See application file for complete search history.

(56) References Cited

U.S. PATENT DOCUMENTS

| | | | | |
|---|---|---|---|---|
| 4,600,258 A | * | 7/1986 | Hu ....................... | H01R 13/447 439/135 |
| 4,713,016 A | | 12/1987 | Kato | |
| 6,869,297 B2 | * | 3/2005 | Caveney ............ | H01R 13/4536 439/138 |

(Continued)

FOREIGN PATENT DOCUMENTS

| | | |
|---|---|---|
| JP | S62-172671 A | 7/1987 |
| JP | 2001-203032 A | 7/2001 |

OTHER PUBLICATIONS

ITmedia Inc., "Windows Insider Glossary: USB 3.0 (Universal Serial Bus 3.0)," [online], Jun. 8, 2009, [Searched on Oct. 10, 2017], Internet <URL: http://www.atmarkit.co.jp/ait/articles/0906/08/news109.html> (Jun. 8, 2009).

*Primary Examiner* — Chandrika Prasad
(74) *Attorney, Agent, or Firm* — Lewis Roca Rothgerber Christie LLP

(57) ABSTRACT

An electronic device includes a housing, a socket which is placed in the housing and includes a first protruding member having a first terminal connectable to a first connector and a second connector, a second protruding member having a second terminal connectable to the second connector, and one recess which is formed around the first protruding member and the second protruding member and between the first protruding member and the second protruding member, and a tilt restraining member configured to restrain the first connector fitted with the first protruding member from tilting toward the second protruding member.

6 Claims, 8 Drawing Sheets

(56) References Cited

U.S. PATENT DOCUMENTS

| | | | | |
|---|---|---|---|---|
| 7,686,630 | B2 * | 3/2010 | Takehara | H01R 13/5213 |
| | | | | 439/140 |
| 8,057,249 | B1 * | 11/2011 | Tobey | H01R 24/64 |
| | | | | 439/345 |
| 2010/0220937 | A1 * | 9/2010 | Furbeck | H04N 19/147 |
| | | | | 382/246 |
| 2013/0017695 | A1 * | 1/2013 | Tanaka | H01R 12/83 |
| | | | | 439/135 |
| 2013/0309883 | A1 * | 11/2013 | Wolfe | H01R 13/58 |
| | | | | 439/106 |

* cited by examiner

ELECTRONIC DEVICE HAVING A TILT RESTRAINING MEMBER

CROSS-REFERENCE TO RELATED APPLICATIONS

This application is based upon and claims the benefit of priority of prior Japanese Patent Application No. 2017-215636, filed on Nov. 8, 2017, the entire contents of which are incorporated herein by reference.

TECHNICAL FIELD

The present embodiment relates to an electronic device.

BACKGROUND

A variety of communication standards are used to connect electronic devices to different electronic devices or peripheral devices in a wired configuration. In the communication standards, the shapes of connectors (plugs: inlet side) and sockets (receptacles: outlet side) are defined and compatibility with the conventional connectors and sockets is preferably maintained in upgrading the versions of the communication standards. USB (Universal Serial Bus) 3.0 is available as one example of standards defining the shapes of sockets in consideration of compatibility with USB 2.0 connectors and sockets.

Non-Patent Literature 1 (ITmedia Inc., "Windows Insider Glossary: USB 3.0 (Universal Serial Bus 3.0)," [online], Jun. 8, 2009, [Searched on Oct. 10, 2017], Internet URL: http://www.atmarkit.co.jp/ait/articles/0906/08/news109.ht ml) discloses the shapes of USB 3.0 standard Type-B (Standard-B) sockets. A USB 3.0 standard Type-B socket includes a protruding member including a USB 2.0 standard terminal for communication based on the USB 2.0 standard upon connection to a USB 2.0 standard connector, and a protruding member including a terminal added based on the USB 3.0 standard.

SUMMARY

When a USB 2.0 standard connector is plugged into a USB 3.0 standard Type-B socket, since no object is connected to a terminal added based on the USB 3.0 standard, a space is present around a protruding member including the terminal added based on the USB 3.0 standard. Therefore, when a force acting toward the protruding member including the terminal added based on the USB 3.0 standard is applied to the plugged USB 2.0 standard connector, a force may act on and damage the protruding member including the USB 2.0 standard terminal.

It is an object of the present embodiment to provide an electronic device which can prevent damage of a protruding member including a terminal for a socket.

According to an aspect of the device, there is provided an electronic device. The electronic device includes a housing, a socket which is placed in the housing and includes a first protruding member having a first terminal connectable to a first connector and a second connector, a second protruding member having a second terminal connectable to the second connector, and one recess which is formed around the first protruding member and the second protruding member and between the first protruding member and the second protruding member, and a tilt restraining member configured to restrain the first connector fitted with the first protruding member from tilting toward the second protruding member.

The object and advantages of the invention will be realized and attained by means of the elements and combinations particularly pointed out in the claims. It is to be understood that both the foregoing general description and the following detailed description are exemplary and explanatory, and are not restrictive of the invention, as claimed.

DESCRIPTION OF EMBODIMENTS

Hereinafter, an electronic device according to an embodiment will be described with reference to the drawings. However, it should be noted that the technical scope of the invention is not limited to these embodiments, and extends to the inventions described in the claims and their equivalents.

Electronic devices according to embodiments will be described below with reference to the drawings. However, it should be noted that the technical scope of the present embodiment is not limited to these embodiments and encompasses the embodiment described in the scope of claims and its equivalents.

First Embodiment

Figure 1A:
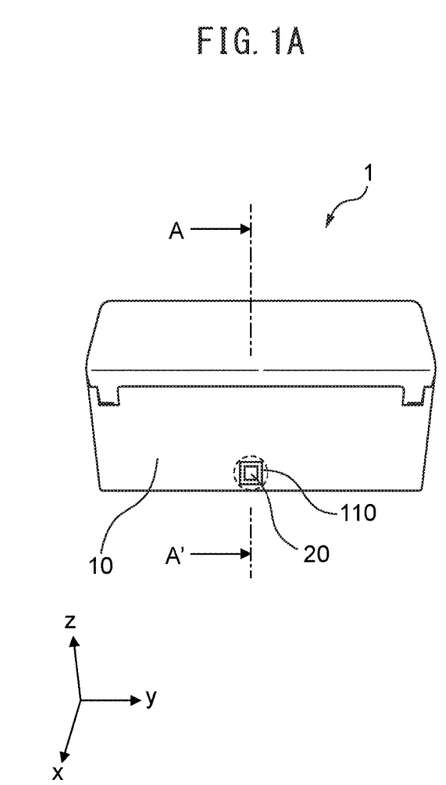
FIG. 1A is a perspective view illustrating an exemplary electronic device 1.
Figure 1B:
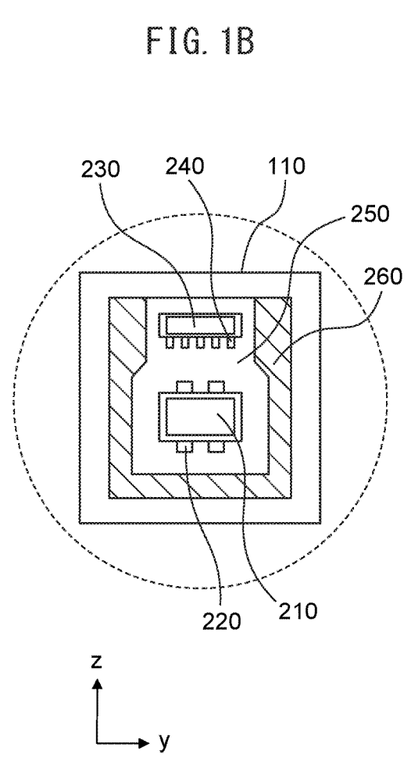
FIG. 1B is an enlarged view in the vicinity of an opening 110.
Figure 1C:
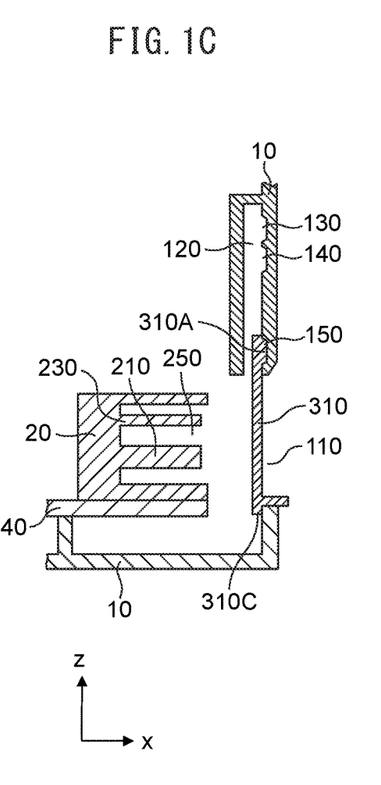
FIG. 1C is a sectional view illustrating an exemplary cross-section of the electronic device 1 taken along a line A-A'.

FIG. 1A is a perspective view illustrating an exemplary electronic device 1 (a view illustrating the back surface of the electronic device 1 when viewed from obliquely above), FIG. 1B is an enlarged view in the vicinity of an opening 110, and FIG. 1C is a sectional view illustrating an exemplary cross-section of the electronic device 1 taken along a line A-A'.

The electronic device 1 includes, e.g., a housing 10 and a socket 20, as illustrated in FIG. 1A. Taking a scanner as an example in this embodiment, the structures of the socket 20 and its vicinity for connecting the scanner to, e.g., a personal computer will be mainly described below. The socket 20 is placed in the housing 10, which includes an opening 110 for exposing the front surface of the socket 20 outside. FIG. 1A illustrates how an access member 310 (to be described later) is open.

The socket 20 includes a first protruding member 210 including a first terminal 220 serving as a USB 2.0 standard terminal, and a second protruding member 230 including a second terminal 240 serving as a terminal added based on the USB 3.0 standard, as illustrated in FIG. 1B. The socket 20 serves as a USB 3.0 standard Type-B socket and is connected to an electronic component in the electronic device 1. A frame member 260 surrounds the first protruding member 210 and the second protruding member 230 and forms a recess 250 around the first protruding member 210 and the second protruding member 230 and between the first protruding member 210 and the second protruding member 230. The socket 20 is fixed to an electronic circuit board 40 placed in the housing 10 and the electronic circuit board 40 is fastened to the housing 10 by, e.g., screws (not illustrated).

An access member 310 is mounted in the opening 110 of the housing 10 as an exemplary tilt restraining member 30, as illustrated in FIG. 1C. The access member 310 opens and closes at least the front surface of the second protruding member 230 in the opening 110 of the housing 10. The access member 310 is mounted inside the housing 10 to be movable vertically (in the z-direction) along the interior of the housing 10. The access member 310 includes a projection 310A projecting into the housing 10 at its upper end, and an abutment portion 310C (to be described later) at its lower end.

A groove 120 is formed in the housing 10 to allow the access member 310 to slide between them in vertical movement. A first recess 130, a second recess 140, and a third recess 150 are formed in the groove 120 and can be fitted with the projection 310A of the access member 310.

Figure 2A:
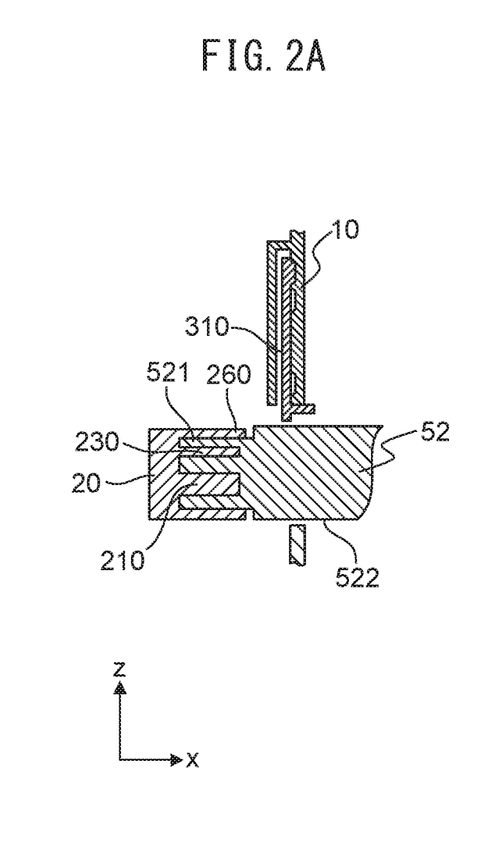
FIG. 2A is a sectional view illustrating an exemplary state in which a second connector 52 is plugged into a socket 20.
Figures 2B, 2C:
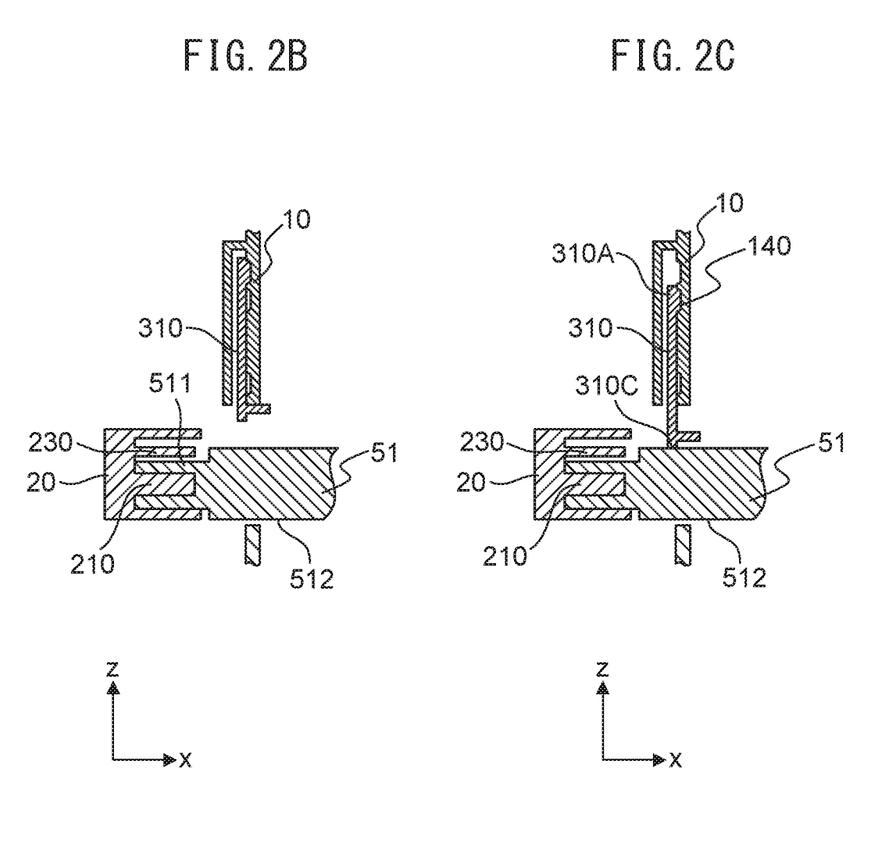
FIGS. 2B and 2C are sectional views illustrating exemplary states in which a first connector 51 is plugged into the socket 20.

FIG. 2A is a sectional view illustrating an exemplary state in which a second connector 52 is plugged into the socket 20, and FIGS. 2B and 2C are sectional views illustrating exemplary states in which a first connector 51 is plugged into the socket 20.

The first connector 51 serves as a USB 2.0 standard Type-B connector. The first connector 51 is fitted with the first protruding member 210 of the socket 20 and can be connected to the first terminal 220, but it is not fitted with the second protruding member 230 and is not connected to the second terminal 240. The first connector 51 includes, e.g., a plug portion 511 to be plugged into the socket 20, and a gripping portion 512 gripped by the user in plugging and pulling the first connector 51 into and out of the socket 20. The gripping portion 512 is formed thicker than the plug portion 511.

The second connector 52 serves as a USB 3.0 standard Type-B connector, is fitted with the first protruding member 210 and the second protruding member 230 of the socket 20, and can be connected to the first terminal 220 and the second terminal 240. The second connector 52 includes, e.g., a plug portion 521 to be plugged into the socket 20, and a gripping portion 522 gripped by the user in plugging and pulling the second connector 52 into and out of the socket 20. The gripping portion 522 is formed thicker than the plug portion 521.

As illustrated in FIG. 2A, when the second connector 52 is plugged into the socket 20, the user of the electronic device 1 lifts the access member 310 to expose the front surface defining the recess 250 of the socket 20 outside. Plugging the second connector 52 into the socket 20 allows the second connector 52 to be fitted with the first protruding member 210 and the second protruding member 230 of the socket 20. Upon plugging of the second connector 52 into the socket 20, even when a force acting toward the second protruding member 230 (in the z-direction of FIG. 2A) is applied to the gripping portion 522 of the second connector 52, the first protruding member 210 and the second protruding member 230 are not damaged. This is because the second connector 52 is restrained from moving toward the second protruding member 230 (in the z-direction of FIG. 2A) by the entire frame member 260.

As illustrated in FIG. 2B, when the first connector 51 is plugged into the socket 20, the first connector 51 is fitted with the first protruding member 210 of the socket 20, but it is not fitted with the second protruding member 230. The upper surface of the plug portion 511 of the first connector 51 comes into contact with neither the upper surface defining the recess 250 of the socket 20 nor the lower surface of the second protruding member 230. When the first connector 51 is plugged into the socket 20, and a force acting toward the second protruding member 230 is applied to the gripping portion 512 of the first connector 51, since the first connector 51 moves to the second protruding member 230 while being fitted with the first protruding member 210, the first protruding member 210 may be damaged. To prevent such damage, the electronic device 1 according to the present embodiment includes an access member 310 as a tilt restraining member for the first connector 51.

As illustrated in FIG. 2C, when the first connector 51 is used, the access member 310 is lowered to fit the projection 310A with the second recess 140 in the housing 10 to lock the access member 310 into the housing 10. Even when the first connector 51 is about to tilt toward the second protruding member 230 upon the application of an upward force to the gripping portion 512 of the first connector 51, the abutment portion 310C of the access member 310 abuts against the first connector 51 to prevent the first connector 51 from tilting more. Therefore, no fundamental strong force acts on the first protruding member 210, which can be prevented from being damaged.

When the first connector 51 is correctly plugged, the abutment portion 310C of the access member 310 may be abutting against or slightly separated from the gripping portion 512 of the first connector 51. When the abutment portion 310C is positioned to abut against the first connector 51, the abutment portion 310C and the first connector 51 close the opening area of the socket 20, thus further enhancing the effect of preventing the entrance of dust into the socket 20.

First Modification

Figure 3A:
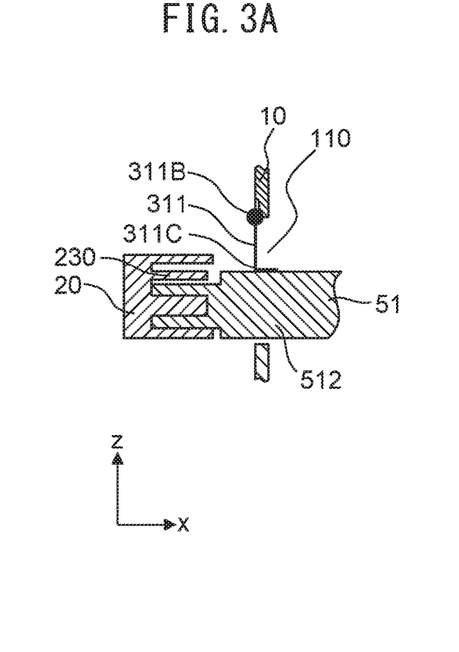
FIGS. 3A and 3B are views illustrating another exemplary tilt restraining member according to a first modification.
Figure 3B:
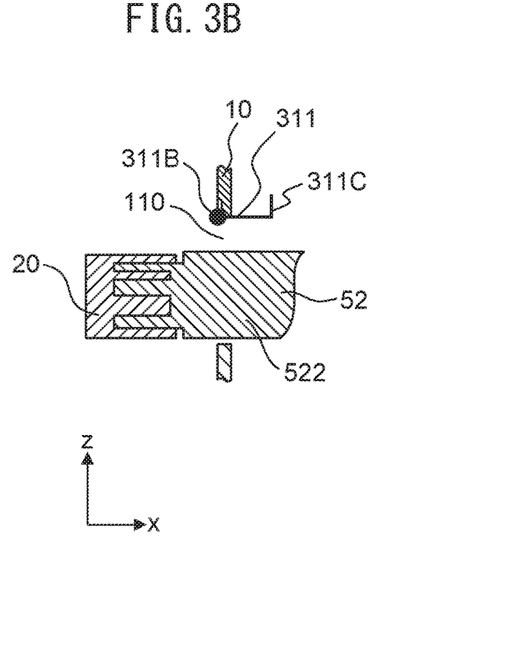

FIGS. 3A and 3B are views illustrating another exemplary tilt restraining member according to a first modification. This modification is different from the first embodiment in that in the former an access member 311 rotatable with respect to a housing 10 is used as a tilt restraining member, in place of the access member 310 illustrated in FIG. 2. The same reference numerals as in the first embodiment denote the same components in the first modification, and a description thereof will not be given.

The access member 311 includes a rotating shaft 311B and an abutment portion 311C. The rotating shaft 311B is mounted in the vicinity of the upper end of an opening 110 in the housing 10 and extends in the lateral direction (the y-direction in FIGS. 3A and 3B) of the housing 10.

As illustrated in FIG. 3A, when a first connector 51 is inserted into the opening 110 and plugged into a socket 20, the access member 311 is mounted in the housing 10 so that the abutment portion 311C of the access member 311 is set directly above a gripping portion 512 of the first connector 51. In this state, even when the first connector 51 is about to tilt toward a second protruding member 230 upon the application of an upward force to the gripping portion 512 of the first connector 51, since the abutment portion 311C of the access member 311 supports the gripping portion 512, the first connector 51 is restrained from tilting. Therefore, no fundamental strong force acts on a first protruding member 210, which can be prevented from being damaged.

As illustrated in FIG. 3B, when the user uses a second connector 52, the abutment portion 311C of the access member 311 is pulled out of the housing 10 first. Thus, the access member 311 rotates about the rotating shaft 311B and the opening 110 in the housing 10 fully opens. The user inserts the second connector 52 into the fully-open opening 110 to plug it into the socket 20 and completes the connection operation of the second connector 52.

In plugging the first connector 51 into the socket 20, the user may plug the first connector 51 with the access member 311 kept at the position illustrated in FIG. 3A, or plug it after pulling the access member 311 out of the housing 10.

Second Modification

Figure 4:
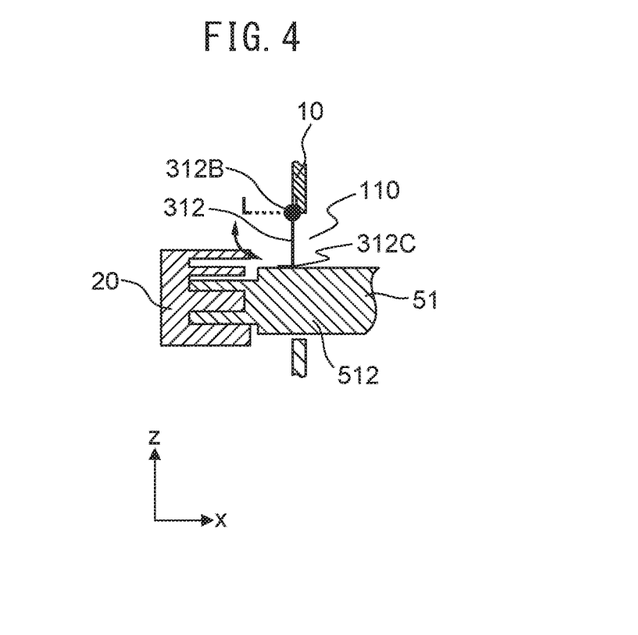
FIG. 4 is a view illustrating still another exemplary tilt restraining member according to a second modification.

FIG. 4 is a view illustrating still another exemplary tilt restraining member according to a second modification. The second modification is different from the first embodiment in that in the former an access member 312 which can move into a housing 10 is used as a tilt restraining member, in place of the access member 310 illustrated in FIG. 2. The same reference numerals as in the first embodiment denote the same components in the second modification, and a description thereof will not be given.

The access member 312 includes a rotating shaft 312B and an abutment portion 312C. When the user inserts a second connector 52 into an opening 110 in the housing 10 with the opening 110 partially covered with the access member 312, the access member 312 is pushed by the second connector 52 and rotates about the rotating shaft 312B to enter the housing 10. The rotated access member 312 moves to a position which allows the second connector 52 to be plugged into a socket 20 without any problem. The user plugs the second connector 52 into the socket 20 and completes the connection operation of the second connector 52. Hence, the user who uses the electronic device 1 according to the second modification enables movement of the access member 312 and plugging of the second connector 52 into the socket 20 by only one operation.

In inserting a first connector 51 into the opening 110 in the housing 10, the first connector 51 is inserted into the opening 110 with the access member 312 kept the same (without rotation to enter the housing 10). In this state, the abutment portion 312C of the access member 312 abuts against a gripping portion 512 of the first connector 51. Even when the first connector 51 is about to tilt toward a second protruding member 230 upon the application of an upward force to the gripping portion 512 of the first connector 51, since the abutment portion 312C of the access member 312 supports the gripping portion 512, the first connector 51 is restrained from tilting. Therefore, no fundamental strong force acts on a first protruding member 210, which can be prevented from being damaged.

In plugging the first connector 51 into the socket 20, the user may plug the first connector 51 with the access member 312 kept at the position illustrated in FIG. 4, or plug it after rotating the access member 312.

Third Modification

Figure 5A:
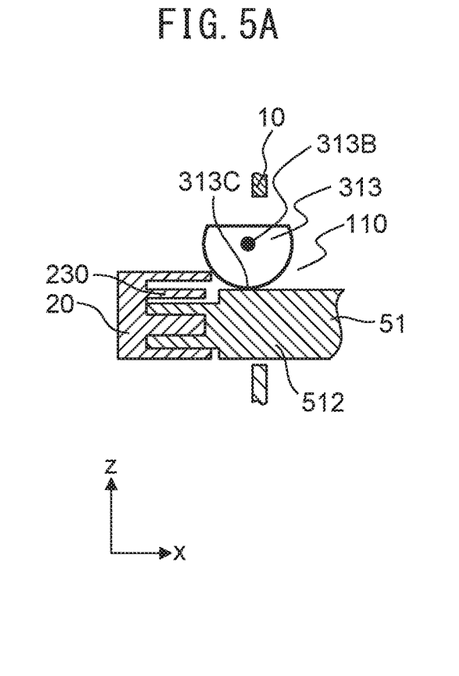
FIGS. 5A and 5B are views illustrating still another exemplary tilt restraining member according to a third modification.
Figure 5B:
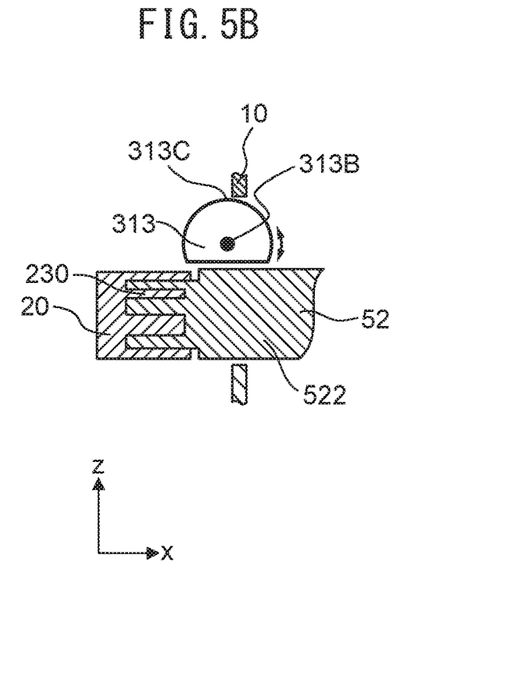

FIGS. 5A and 5B are views illustrating still another exemplary tilt restraining member according to a third modification. The third modification is different from the first embodiment in that in the former an access member 313 having the shape of a cylinder partially cut away along a line in the x-z plane of FIGS. 5A and 5B is used as a tilt restraining member, in place of the access member 310 illustrated in FIG. 2. The same reference numerals as in the first embodiment denote the same components in the third modification, and a description thereof will not be given.

The access member 313 includes a rotating shaft 313B and an abutment portion 313C. The outer shape of the access member 313 in the x-z plane of FIGS. 5A and 5B is defined by a curved portion (abutment portion 313C) forming an arc, and a linear portion connecting the two ends of the curved portion to each other. The rotating shaft 313B serves as an axis passing through the center of a circle including the arc and is fixed to a certain portion (not illustrated) in a housing 10. The access member 313 is normally set in the state illustrated in FIG. 5A.

As illustrated in FIG. 5A, when a first connector 51 is plugged into a socket 20, the abutment portion 313C abuts against a gripping portion 512 of the first connector 51. In this state, even when the first connector 51 is about to tilt toward a second protruding member 230 upon the application of an upward force to the gripping portion 512 of the first connector 51, since the abutment portion 313C of the access member 313 supports the gripping portion 512, the first connector 51 is restrained from tilting. Therefore, no fundamental strong force acts on a first protruding member 210, which can be prevented from being damaged.

In plugging the first connector 51 into the socket 20, the user may plug the first connector 51 with the abutment portion 313C of the access member 313 facing the first protruding member 210, or plug it with the linear portion facing the first protruding member 210.

As illustrated in FIG. 5B, when a second connector 52 is plugged into the socket 20, the user first rotates the access member 313 to allow the linear portion of the access member 313 to face the first protruding member 210 of the socket 20. The second connector 52 is plugged into the socket 20 via a space formed in an opening 110 upon rotation, and the connection operation of the second connector 52 is completed.

Fourth Modification

Figure 6:
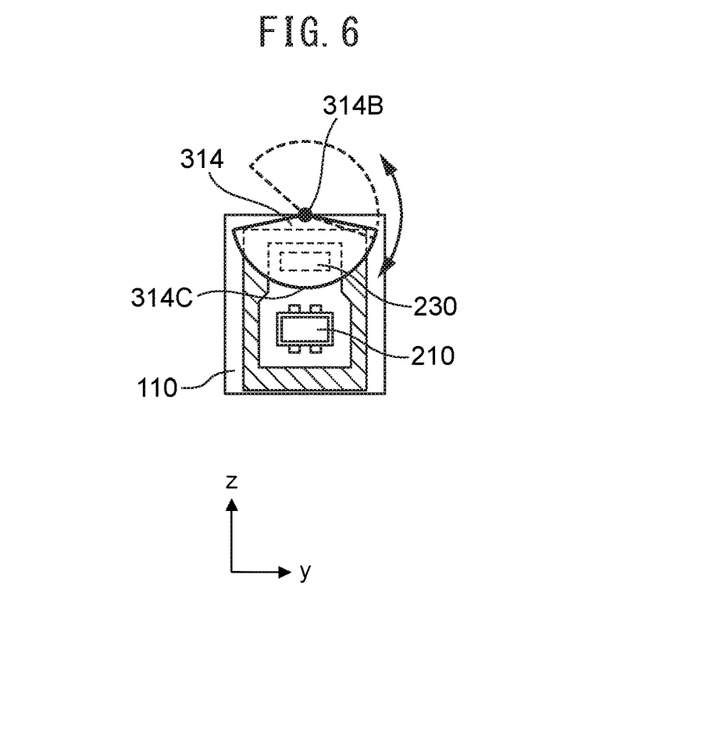
FIG. 6 is a view illustrating still another exemplary tilt restraining member according to a fourth modification.

FIG. 6 is a view illustrating still another exemplary tilt restraining member according to a fourth modification. The fourth modification is different from the first embodiment in that in the former an access member 314 having the shape of a sector is used as a tilt restraining member, in place of the access member 310 illustrated in FIG. 2. The same reference numerals as in the first embodiment denote the same components in the fourth modification, and a description thereof will not be given.

The access member 314 includes a rotating shaft 314B and an abutment portion 314C. The outer shape of the access member 314 in the y-z plane of FIG. 6 is defined by a curved portion (abutment portion 314C) forming an arc, and two linear portions connecting the rotating shaft 314B to the arc. The rotating shaft 314B corresponds to an axis passing through the center of a circle including the arc.

The rotating shaft 314B is mounted in a housing 10 to run perpendicularly to an opening 110 in an electronic device 1 (to extend in the x-direction), and the access member 314 rotates along the housing 10 about the rotating shaft 314B.

When a first connector 51 is plugged into a socket 20 with the access member 314 kept in the state indicated by a solid line in FIG. 6, the access member 314 is mounted in the housing 10 so that the abutment portion 314C is set directly above a gripping portion 512 of the first connector 51. In this state, even when the first connector 51 is about to tilt toward a second protruding member 230 upon the application of an upward force to the gripping portion 512 of the first connector 51, since the abutment portion 314C of the access member 314 supports the gripping portion 512, the first connector 51 is restrained from tilting. Therefore, no fundamental strong force acts on a first protruding member 210, which can be prevented from being damaged.

When a second connector 52 is plugged into the socket 20, the user rotates the access member 314 to allow the abutment portion 314C of the access member 314 to face opposite to the opening 110 in the housing 10 (see the portion of the access member 314 indicated by a dotted line in FIG. 6). The second connector 52 is plugged into the socket 20 via a space formed in the opening 110 upon rotation, and the connection operation of the second connector 52 is completed.

In plugging the first connector 51 into the socket 20, the user may plug the first connector 51 with the abutment portion 314C of the access member 314 facing the first protruding member 210, or plug it with the abutment portion 314C of the access member 314 facing opposite to the opening 110 in the housing 10.

Fifth Modification

Figure 7A:
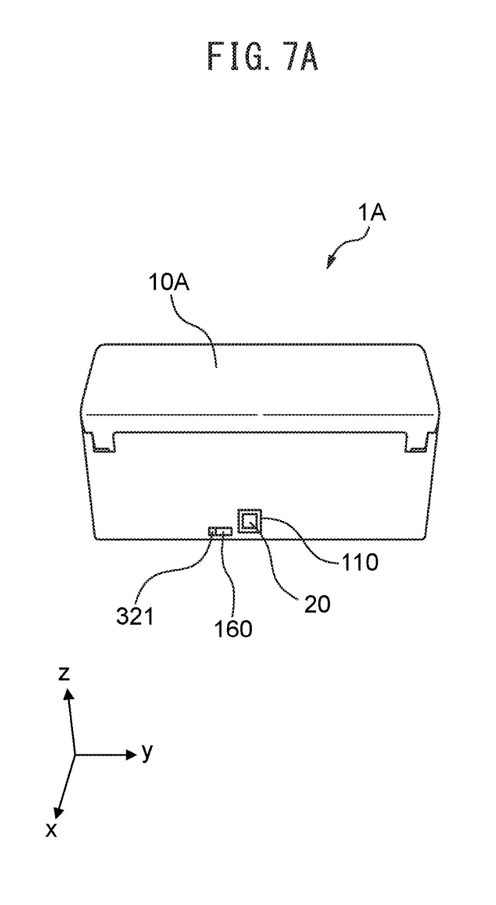
FIG. 7A is a perspective view illustrating another exemplary electronic device according to a fifth modification.
Figure 7B:
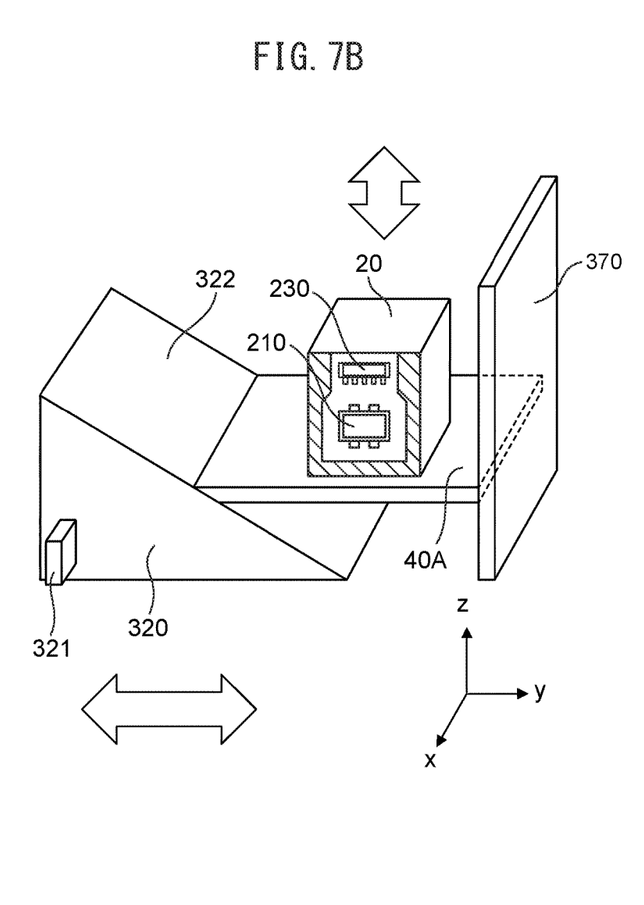
FIG. 7B is a perspective view illustrating an exemplary movement mechanism 320.
Figure 8A:
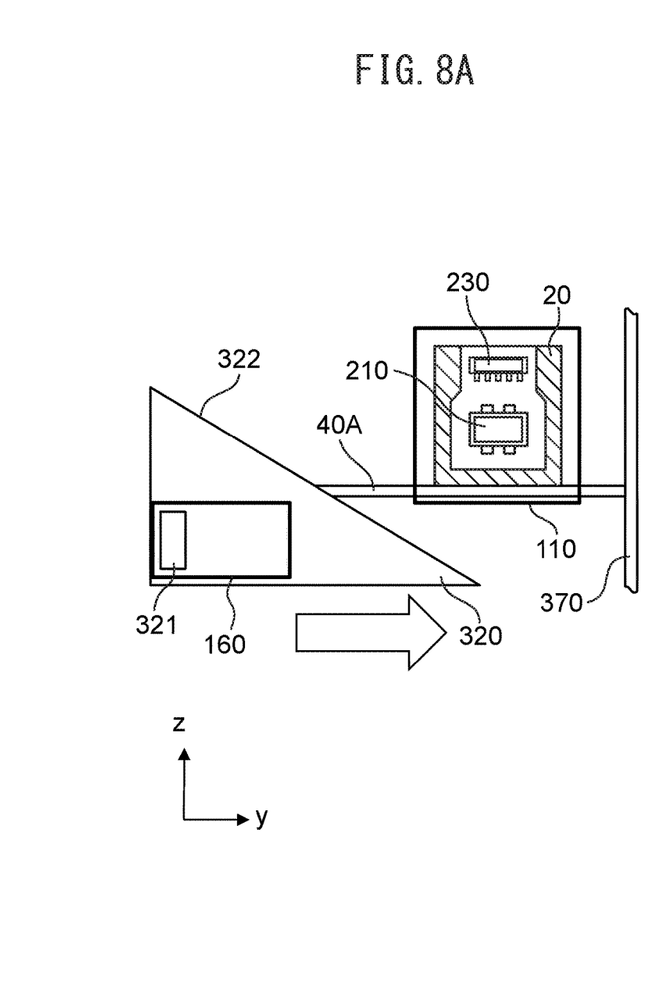
FIGS. 8A and 8B are views for explaining the movement mechanism 320 according to the fifth modification.
Figure 8B:
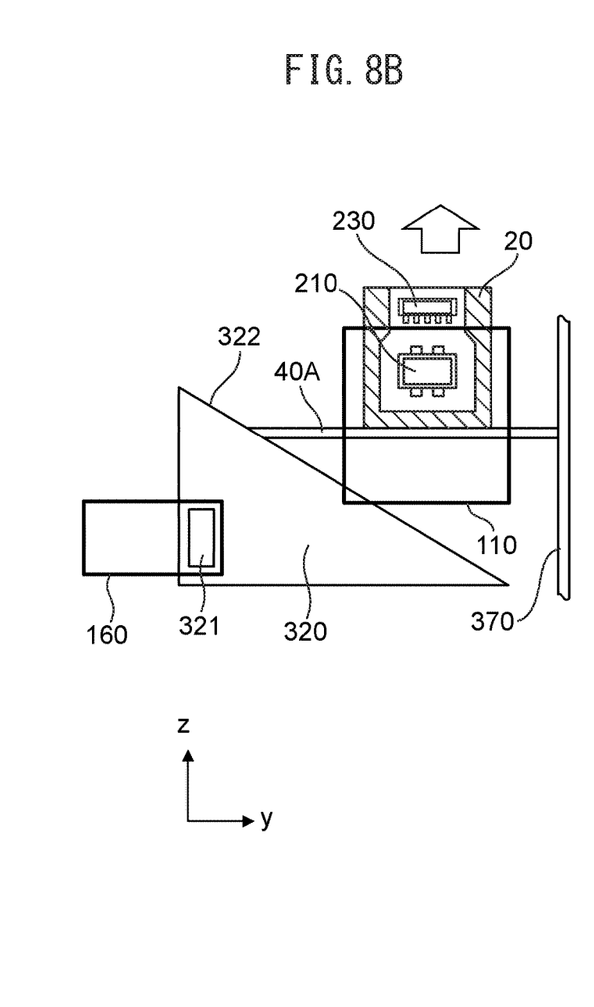

FIG. 7A is a perspective view illustrating another exemplary electronic device according to a fifth modification (a view illustrating the back surface of an electronic device 1A when viewed from obliquely above), FIG. 7B is a perspective view illustrating an exemplary movement mechanism 320, and FIGS. 8A and 8B are views for explaining the movement mechanism 320 according to the fifth modification. The fifth modification is different from the first embodiment in that in the former the area of a socket 20 exposed outside via an opening 110 in a housing 10A further including a different opening 160 is widened or narrowed. The same reference numerals as in the first embodiment denote the same components in the fifth modification, and a description thereof will not be given.

In the fifth modification, the socket 20 is mounted on a socket board 40A which can vertically move by the movement mechanism 320, as illustrated in FIG. 7B. The movement mechanism 320 has the shape of a triangular prism including a gripping portion 321 and a movement surface 322. The gripping portion 321 is exposed out of the different opening 160 in the housing 10A, and the user can horizontally move the gripping portion 321 from the exterior of the housing 10A, as illustrated in FIG. 7A. The gripping portion 321 is horizontally moved to, in turn, horizontally move the movement mechanism 320, and the socket board 40A vertically moves along the movement surface 322 with the movement of the movement mechanism 320. The socket board 40A has its one end movable along the movement surface 322 and its other end movable along a plate 370 fixed to the housing 10A.

As illustrated in FIG. 8A, when the gripping portion 321 is on the leftmost side in the different opening 160 in FIG. 8A, the positional relationship between the movement mechanism 320 and the socket board 40A is determined so that the entire front surface of the socket 20 is exposed out of the opening 110 in the housing 10A. In this state, the user plugs a second connector 52 into the socket 20.

As illustrated in FIG. 8B, when the gripping portion 321 is on the rightmost side in the different opening 160 in FIG. 8B, the positional relationship between the movement mechanism 320 and the socket board 40A is determined so that only a portion of a first protruding member 210 in the front surface of the socket 20 is exposed out of the opening 110 in the housing 10A. In this state, the user plugs a first connector 51 into the socket 20.

In the state illustrated in FIG. 8B, even when the first connector 51 plugged into the socket 20 is about to tilt toward a second protruding member 230, the portion above the opening 110 in the housing 10A abuts against the first connector 51 to prevent the first connector 51 from tilting more. In other words, the end of the opening 110 in the housing 10A functions as a tilt restraining member. Therefore, no fundamental strong force acts on the first protruding member 210, which can be prevented from being damaged.

Sixth Modification

Figure 9A:
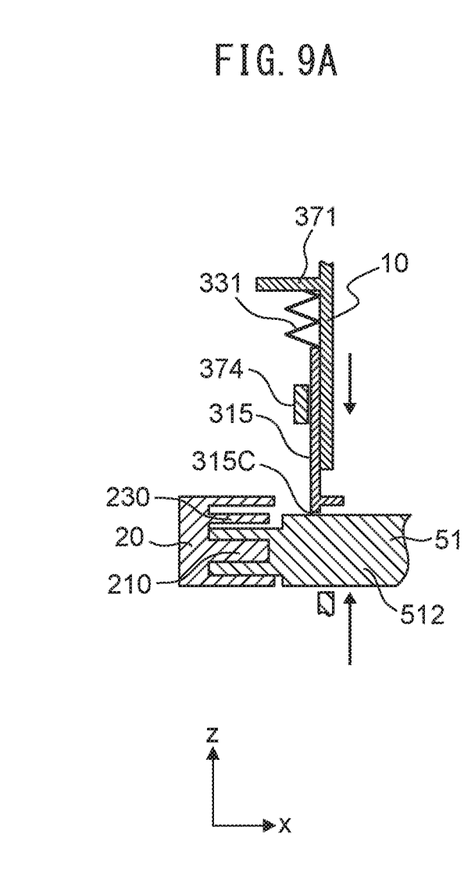
FIG. 9A is a view illustrating still another exemplary tilt restraining member according to a sixth modification.

FIG. 9A is a view illustrating still another exemplary tilt restraining member according to a sixth modification. The sixth modification is different from the first embodiment in that in the former a compression spring 331 is used to allow an access member serving as a tilt restraining member to press against a connector. The same reference numerals as in the first embodiment denote the same components in the sixth modification, and a description thereof will not be given.

In the sixth modification, as illustrated in FIG. 9A, a compression spring 331 is mounted under a plate 371 fixed to a housing 10, and an access member 315 is mounted under the compression spring 331 and between the side surface of the housing 10 and a back plate 374. An access member 315 is a kind of a plate. The compression spring 331 is attached to the fixed plate 371 to press down the access member 315 abutting against a first connector 51 when the first connector 51 plugged into a socket 20 is about to tilt upwards.

As illustrated in FIG. 9A, when the first connector 51 is plugged into the socket 20, as the first connector 51 is about to tilt toward a second protruding member 230 upon the application of an upward force to a gripping portion 512 of the first connector 51, an abutment portion 315C of the access member 315 presses against the gripping portion 512. Therefore, the first connector 51 is restrained from tilting and no fundamental strong force acts on a first protruding member 210, which can be prevented from being damaged.

In plugging a second connector 52 into the socket 20, the second connector 52 is plugged into the socket 20 while pressing up the abutment portion 315C of the access member 315 by a gripping portion 522 of the second connector 52.

When the first connector 51 is correctly plugged into the socket 20, the compression spring 331 may not press, or may slightly press the access member 315. An elastic member such as a rubber member may even be substituted for the compression spring 331.

Seventh Modification

Figure 9B:
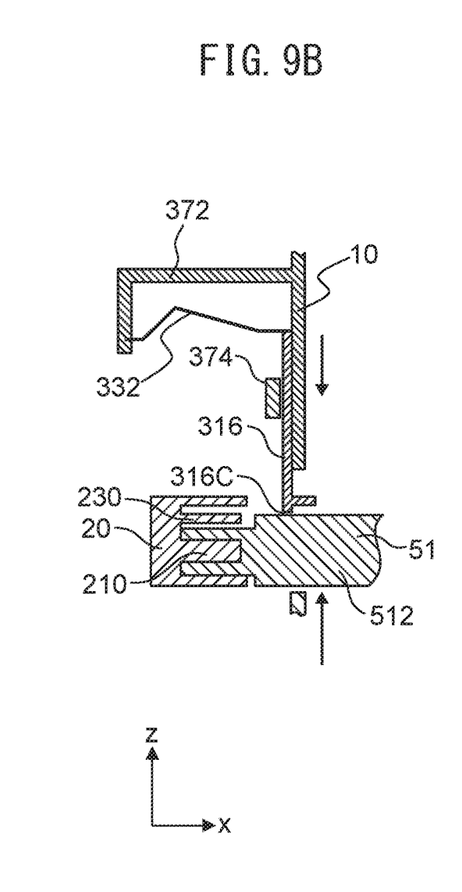
FIG. 9B is a view illustrating still another exemplary tilt restraining member according to a seventh modification.

FIG. 9B is a view illustrating still another exemplary tilt restraining member according to a seventh modification. The seventh modification is different from the first embodiment in that in the former a leaf spring 332 is used to allow an access member serving as a tilt restraining member to press against a connector. The same reference numerals as in the first embodiment denote the same components in the seventh modification, and a description thereof will not be given.

In the seventh modification, as illustrated in FIG. 9B, a leaf spring 332 is mounted under a plate 372 fixed to a housing 10, and an access member 316 is mounted under the leaf spring 332 and between the side surface of the housing 10 and a back plate 374. An access member 316 is a kind of a plate. The leaf spring 332 is attached to the fixed plate 372 to press down the access member 316 abutting against a first connector 51 when the first connector 51 plugged into a socket 20 is about to tilt upwards.

As illustrated in FIG. 9B, when the first connector 51 is plugged into the socket 20, as the first connector 51 is about to tilt toward a second protruding member 230 upon the application of an upward force to a gripping portion 512 of the first connector 51, an abutment portion 316C of the access member 316 presses against the gripping portion 512. Therefore, the first connector 51 is restrained from tilting and no fundamental strong force acts on a first protruding member 210, which can be prevented from being damaged.

In plugging a second connector 52 into the socket 20, the second connector 52 is plugged into the socket 20 while pressing up the abutment portion 316C of the access member 316 by a gripping portion 522 of the second connector 52.

When the first connector 51 is correctly plugged into the socket 20, the leaf spring 332 may not press, or may slightly press the access member 316. Other types of springs such as a torsion coil spring may even be substituted for the leaf spring 332.

Eighth Modification

Figure 9C:
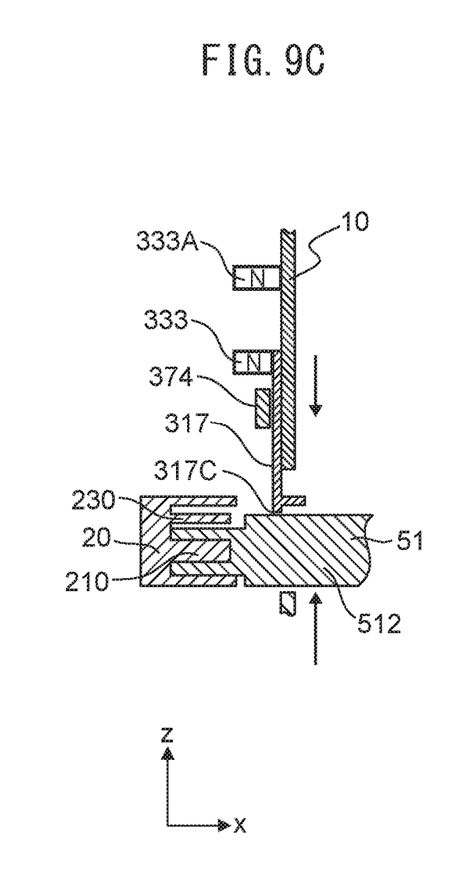
FIG. 9C is a view illustrating still another exemplary tilt restraining member according to an eighth modification.

FIG. 9C is a view illustrating still another exemplary tilt restraining member according to an eighth modification. The eighth modification is different from the first embodiment in that in the former magnets 333 and 333A are used to allow an access member serving as a tilt restraining member to press against a connector. The same reference numerals as in the first embodiment denote the same components in the eighth modification, and a description thereof will not be given.

In the eighth modification, as illustrated in FIG. 9C, a magnet 333 is fixed to an access member 317, and a magnet 333A having the same polarity as that of the magnet 333 is fixed to a housing 10 at a position above the access member 317. An access member 317 is a kind of a plate. The access member 317 is mounted between the side surface of the housing 10 and a back plate 374. The magnets 333 and 333A have the same polarity and therefore repel each other to press down the access member 317 abutting against a first connector 51 when the first connector 51 plugged into a socket 20 is about to tilt upwards.

As illustrated in FIG. 9C, when the first connector 51 is plugged into the socket 20, as the first connector 51 is about to tilt toward a second protruding member 230 upon the application of an upward force to a gripping portion 512 of the first connector 51, an abutment portion 317C of the access member 317 presses against the gripping portion 512. Therefore, the first connector 51 is restrained from tilting and no fundamental strong force acts on a first protruding member 210, which can be prevented from being damaged.

In plugging a second connector 52 into the socket 20, the second connector 52 is plugged into the socket 20 while pressing up the abutment portion 317C of the access member 317 by a gripping portion 522 of the second connector 52.

Ninth Modification

Figure 10A:
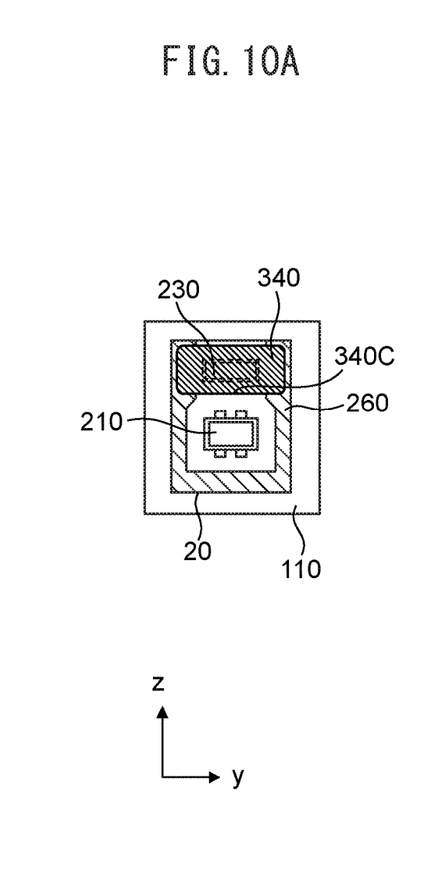
FIG. 10A is a view illustrating still another exemplary tilt restraining member according to a ninth modification.
Figure 10B:
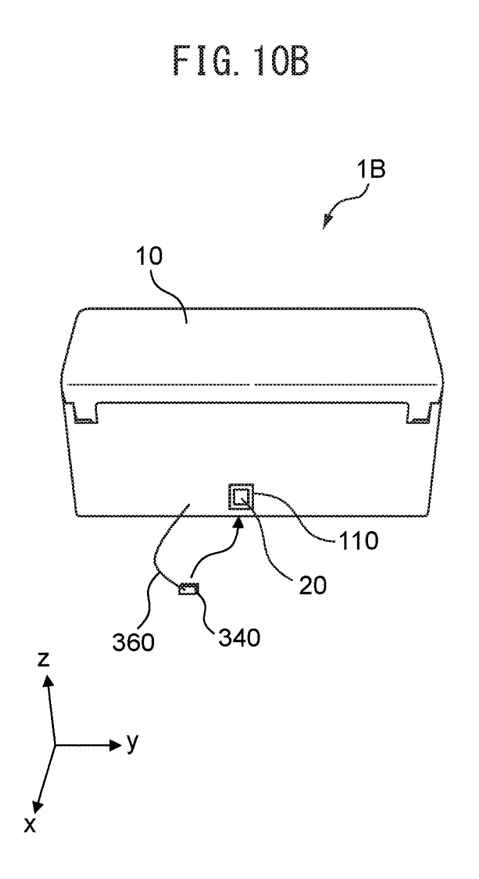
FIG. 10B is a view illustrating still another exemplary electronic device according to the ninth modification.

FIG. 10A is a view illustrating still another exemplary tilt restraining member according to a ninth modification, and FIG. 10B is a view illustrating still another exemplary electronic device according to the ninth modification (a view illustrating the back surface of an electronic device 1B when viewed from obliquely above). The ninth modification is different from the first embodiment in that in the former a cover member 340 is used as a tilt restraining member. The same reference numerals as in the first embodiment denote the same components in the ninth modification, and a description thereof will not be given.

The cover member 340 is magnetized and includes an abutment portion 340C abutting against a first connector 51, and a string 360 which connects the cover member 340 to a housing 10. A frame member 260 of a socket 20 includes a metallic portion, and the magnetic cover member 340 and the metallic portion of the frame member 260 can be magnetically fixed to each other.

The cover member 340 is fixed to the socket 20 to allow the abutment portion 340C to face a first protruding member 210 so that the abutment portion 340C of the cover member 340 abuts against a gripping portion 512 of the first connector 51. In this state, even when the first connector 51 is about to tilt toward a second protruding member 230 upon the application of an upward force to the gripping portion 512 of the first connector 51, since the cover member 340 is fixed to the socket 20, the first connector 51 is restrained from tilting. Therefore, no fundamental strong force acts on the first protruding member 210, which can be prevented from being damaged.

In plugging a second connector 52 into the socket 20, the user plugs the second connector 52 into the socket 20 without fixing the cover member 340 to the socket 20 and completes the connection operation of the second connector 52.

In plugging the first connector 51 into the socket 20, the user may plug the first connector 51 with the cover member 340 fixed to the socket 20, or fix the cover member 340 to the socket 20 after plugging the first connector 51. The cover member 340 may even be fastened to the socket 20 by, e.g., screwing, instead of magnetically fixing the cover member 340 and the socket 20 to each other.

10th Modification

Figure 10C:
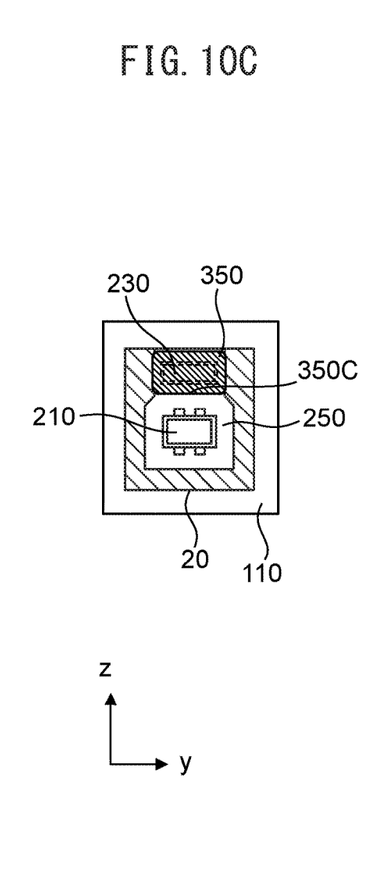
FIG. 10C is a view illustrating still another exemplary tilt restraining member according to a 10th modification.

FIG. 10C is a view illustrating still another exemplary tilt restraining member according to a 10th modification. The 10th modification is different from the first embodiment in that in the former a spacer 350 is used as a tilt restraining member. The same reference numerals as in the first embodiment denote the same components in the 10th modification, and a description thereof will not be given.

The spacer 350 includes an abutment portion 350C abutting against a first connector 51, has a shape which allows fitting with a second protruding member 230, and is made of a nonconductive member such as a resin.

The spacer 350 is pushed into a recess 250 in a socket 20 to be fitted with the second protruding member 230 and is locked into the recess 250 around the second protruding member 230. When the first connector 51 is plugged into the socket 20, the abutment portion 350C of the spacer 350 abuts against a plug portion 511 of the first connector 51 in the recess 250 of the socket 20. In this state, even when the first connector 51 is about to tilt toward the second protruding member 230 upon the application of an upward force to a gripping portion 512 of the first connector 51, since the spacer 350 abuts against the first connector 51 in the recess 250, the first connector 51 is restrained from tilting. Therefore, no fundamental strong force acts on a first protruding member 210, which can be prevented from being damaged.

In plugging a second connector 52 into the socket 20, the user plugs the second connector 52 into the socket 20 without the spacer 350 and completes the connection operation of the second connector 52.

In plugging the first connector 51 into the socket 20, the user may plug the first connector 51 with the spacer 350 fitted with the second protruding member 230, or fit the spacer 350 with the second protruding member 230 after plugging the first connector 51.

While preferred embodiments of the present embodiment have been described above, the present embodiment is not limited thereto. For example, although a USB 3.0 standard Type-B socket and connector are used as the socket 20 and the second connector 52 and a USB 2.0 standard connector is used as the first connector 51 in the above-described examples, such sockets and connectors are not limited to those based on these standards. In addition, the electronic device 1 is not limited to a scanner, and may be implemented as any devices which perform communication using physical connectors and sockets, such as devices built into digital cameras and smartphones.

An electronic device according to the present embodiment can prevent damage of a protruding member including a terminal for a socket.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

The invention claimed is:

1. An electronic device comprising:
   a housing;
   a socket which is placed in the housing and includes a first protruding member having a first terminal connectable to a first connector and a second connector, a second protruding member having a second terminal connectable to the second connector, and one recess which is formed around the first protruding member and the second protruding member and between the first protruding member and the second protruding member; and
   a tilt restraining member configured to restrain the first connector from tilting toward the second protruding member.

2. The electronic device according to claim 1, wherein
   the housing includes an opening configured to expose the recess to an outside of the housing, wherein
   the tilt restraining member is an access member which opens and closes at least a front surface of the second protruding member in the opening, and wherein the access member includes an abutment portion which abuts against the first connector when the first connector tilts toward the second protruding member.

3. The electronic device according to claim 1, wherein
   the housing includes an opening configured to expose the recess to an outside of the housing, wherein
   the tilt restraining member is a movement mechanism which moves the socket relative to the housing to narrow an opening area of the socket in the opening.

4. The electronic device according to claim 1, wherein the tilt restraining member is a cover member which covers a front surface defining the recess between the first protruding member and the second protruding member, and wherein the cover member includes an abutment portion which abuts against the first connector when the first connector tilts toward the second protruding member.

5. The electronic device according to claim 1, wherein the tilt restraining member is a plate which presses against the first connector in a direction from the second protruding member toward the first protruding member, and wherein the plate includes an abutment portion which abuts against the first connector.

6. The electronic device according to claim 1, wherein the tilt restraining member is a spacer placed around the second protruding member in the recess, and wherein the spacer includes an abutment portion which abuts against the first connector when the first connector tilts toward the second protruding member.

* * * * *